United States Patent [19]

Bridges et al.

[11] Patent Number: 4,764,246

[45] Date of Patent: Aug. 16, 1988

[54] BURIED UNDERCUT MESA-LIKE WAVEGUIDE AND METHOD OF MAKING SAME

[75] Inventors: Thomas J. Bridges, Holmdel; Ernest G. Burkhardt, Wall, both of N.J.; Larry A. Coldren, Santa Barbara, Calif.; Thomas L. Koch, Middletown, N.J.

[73] Assignee: American Telephone and Telegraph Company, AT&T Bell Laboratories, Murray Hill, N.J.

[21] Appl. No.: 87,550

[22] Filed: Aug. 20, 1987

Related U.S. Application Data

[62] Division of Ser. No. 762,968, Aug. 6, 1985, Pat. No. 4,725,112.

[51] Int. Cl.$^4$ .................. H01L 21/306; B44C 1/22; C03C 15/00; C03C 25/06

[52] U.S. Cl. .................. 156/643; 156/646; 156/647; 156/649; 156/652; 156/659.1; 156/662; 357/16; 357/17; 357/30; 357/56; 372/45; 437/126; 437/129; 437/228

[58] Field of Search .............. 156/647, 648, 649, 652, 156/655, 659.1, 662, 643, 646; 357/16, 17, 30, 56; 350/96.11, 96.12; 252/79.1; 372/43-50; 437/2, 23, 38, 126, 129, 228

[56] References Cited

U.S. PATENT DOCUMENTS

| | | | |
|---|---|---|---|
| 3,833,435 | 9/1974 | Logan et al. | 156/11 |
| 3,883,219 | 5/1975 | Logan et al. | 350/96 WG |
| 4,099,305 | 7/1978 | Cho et al. | 156/649 X |
| 4,285,763 | 8/1981 | Coldren | 156/643 |
| 4,468,850 | 9/1984 | Liau et al. | 156/649 X |
| 4,662,988 | 5/1987 | Renner | 156/649 X |

OTHER PUBLICATIONS

*Japanese Journal of Applied Physics*, vol. 22, No. 11, 1983, H. Burkhard et al., pp. L721-L723.
*Japanese Journal of Applied Physics*, vol. 21, No. 11, 1982, R. Blondeau et al., p. 1655.
*Applied Physics Letters*, vol. 42, No. 5, 1983, U. Koren et al., pp. 403-405.
*Applied Physics Letters*, vol. 40, No. 7, 1982, Z. Liau et al., pp. 568-570.
*IEEE Journal of Quantum Electronics*, vol. QE-19, No. 5, 1983, T. Chen et al., pp. 783-785.
*Journal of Applied Physics*, vol. 54, No. 5, 1983, T. Chen et al., pp. 2407-2412.
*Applied Physics Letters*, vol. 38, No. 4, 1981, M. A. Bosch et al., pp. 264-266.
*Journal of the Electrochemical Society*, vol. 126, No. 2, 1979, S. B. Phatak, pp. 287-292.
*Journal of the Electrochemical Society*, vol. 123, No. 5, 1976, R. P. Tijburg et al., pp. 687-691.
*Compound Semiconductors*, vol. 1, 1963, J. W. Faust, Jr., pp. 445-468.
*Applied Physics Letters*, vol. 43, No. 5, 1983, A. Hasson et al., pp. 403-405.

*Primary Examiner*—William A. Powell
*Attorney, Agent, or Firm*—Gregory C. Ranieri

[57] ABSTRACT

Epitaxial regrowth by vapor phase epitaxy of controlled composition semiconductor material in and around undercut regions of a processed heterostructure wafer permits formation of a ridge waveguide capable of active or passive operation. Subsequent material selective and crystallographically preferential etching is employed to form mirror facets on each end of the ridge waveguide.

11 Claims, 3 Drawing Sheets

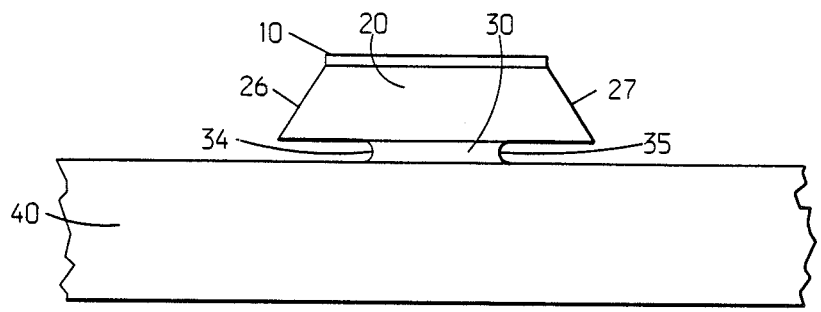
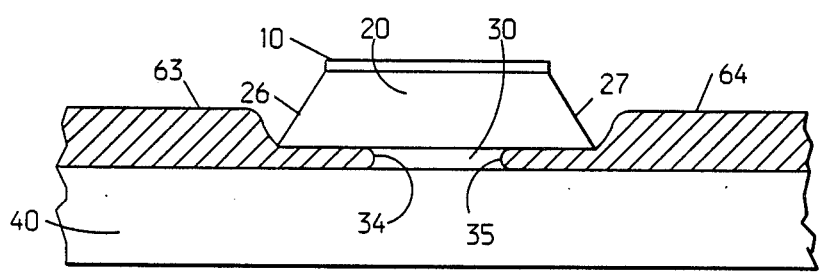
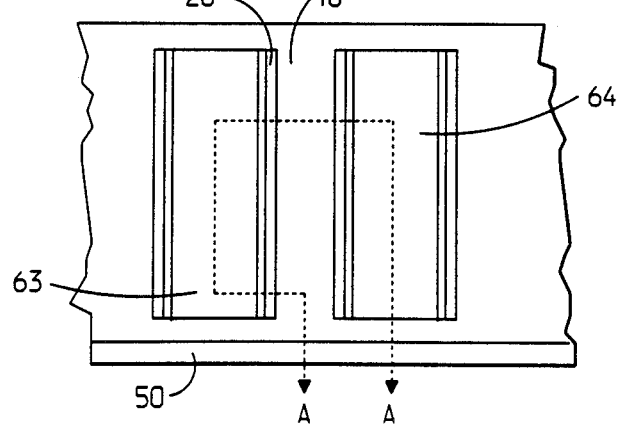

BURIED UNDERCUT MESA-LIKE WAVEGUIDE AND METHOD OF MAKING SAME

This is a division of application Ser. No. 762,968, filed 8/6/85, now U.S. Pat. No. 4,725,112.

TECHNICAL FIELD

This invention relates generally to semiconductor waveguides and, more particularly, to such waveguides having an undercut mesa-like geometry and to a method of making devices comprising such waveguides.

BACKGROUND OF THE INVENTION

Undercut mesa geometries are used as semiconductor heterostructure waveguides, buried heterostructure light sources or exposed mesa light sources. Undercut mesa geometry refers to the fact that, in a heterostructure, a lower layer of the heterostructure is partially etched along at least one exposed edge so that an upper layer is wider than the lower layer thereby forming a mesa-like cross-sectional shape in a plane cutting through all heterostructure layers. In other words, upper layers of the multilayer heterostructure overhang the undercut lower layer. There may be additional layers below the undercut lower layer. The lower layer is generally a light guiding or active layer of the heterostructure whereas the layers surrounding the lower layer are cladding layers.

Undercut mesa geometries have been reported in which the edges of the undercut, guiding layer of the heterostructure are directly exposed to either a vacuum or air. See, for example, U.S. Pat. Nos. 3,833,435 and 3,883,219 issued to R. Logan et al., an article by H. Burkhard et al. in *Japanese Journal of Applied Physics*, Vol. 22, No. 11, pp. L721-3 (1983), and an article by R. Blondeau et al. in *Japanese Journal of Applied Physics*, Vol. 21, No. 11, p. 1655 (1982). As a result of direct exposure to vacuum or air, the guiding layer forms a two-dimensional waveguide exhibiting very strong light guiding properties. Strong guiding results from the significant refractive index difference at the exposed edges of the guiding layer. As such, it is inherently difficult to achieve fundamental transverse mode operation unless the waveguide width is very small. In practice, the transverse mode is controlled by the high scattering loss from imperfections at the large index discontinuity at the waveguide edges.

For some lasers incorporating a similar undercut mesa geometry, the undercut regions are filled with silicon dioxide and polyimide polymer films. See U. Koren et al., *Applied Physics Letters*, Vol. 42, No. 5, pp. 403-5 (1983). The combination of silicon dioxide and polyimide films still results in strong index guiding and high scattering loss. Again, this scattering loss is used to control transverse mode behavior.

In yet another laser structure incorporating the undercut mesa geometry, a mass transport process is employed to fill in the undercut regions with semiconductor material. See Z. Liau et al., *Applied Physics Letters*, Vol. 40, No. 7, pp. 568-70 (1982); T. Chen et al., *IEEE Journal of Quantum Electronics*, Vol. QE-19, No. 5, pp. 783-5 (1983); T. Chen et al., *Journal of Applied Physics*, Vol. 54, No. 5, pp. 2407-12 (1983); and A. Hasson et al., *Applied Physics Letters*, Vol. 43, No. 5, pp. 403-5 (1983). The semiconductor material which fills in the undercut regions migrates from other portions of the structure as a result of high temperature transport phenomena. As such, the composition and conductivity of the semiconductor material which fills in the undercut regions are not under independent control but rather are determined by the locally available exposed semiconductor material such as the material comprising upper (overhanging) and lower cladding layers of the heterostructure. Since the mass transported material has a small refractive index mismatch with respect to the undercut layer, the resulting waveguide is capable of optical confinement without encountering large scattering losses due to the presence of imperfections. Additionally, wider waveguides may be fabricated while maintaining fundamental transverse mode operation.

However, in the case of an active (pumped) waveguide, operation of the resulting waveguide can be substantially degraded by DC leakage currents and high frequency displacement currents because the original highly doped semiconductor material from the cladding layers is in the conduction path including the lower cladding layer, the filled-in undercut regions, and the upper layers of the undercut mesa. Because of these leakage currents, an active device, such as a laser, incorporating this waveguide structure has a degraded high frequency response.

Furthermore, with respect to the mass transport process, it has been found that complete filling of the undercut regions is dependent upon the thickness of each undercut region which, in turn, directly depends upon the thickness of the undercut lower layer. For a relatively thin undercut layer of approximately 0.2 $\mu$m, mass transport appears to perform adequately for filling in the undercut regions adjacent to the undercut layer. However, for a thicker undercut layer, for example, a thickness of approximately 0.3 $\mu$m or greater, which is often desirable in heterostructure devices guiding light at longer wavelengths, such as $\lambda = 1.5$ $\mu$m, mass transport is less effective for filling the undercut regions. It appears, for example, to cause irregularities in the regrown material in the undercut regions leading to a waveguide having poor optical properties or to transport insufficient material. Additional drawbacks of the mass transport method reside in the relatively high temperature and long time required. It will be readily appreciated that the orignal dopant distribution may be changed by diffusion during the mass transport process.

SUMMARY OF THE INVENTION

High scattering loss and large leakage currents are avoided, in accordance with the principles of this invention, by making a semiconductor heterostructure which is processed to form an undercut region and then using an epitaxial vapor phase growth technique to regrow semiconductor material epitaxially and completely or partially fill the undercut region of the mesa. The resulting semiconductor structure is a buried undercut mesa. Versatility of the invention is increased because of the wide variety of semiconductor materials which are suitable for filling in undercut regions. Materials for filling in the undercut regions are selected on the basis of resistivity, conductivity type, refractive index or the like.

For one embodiment of the invention, undercut regions, where epitaxial growth is performed, are along the longitudinal axis of the waveguide.

In another embodiment, the undercut regions are perpendicular to the longitudinal axis of the waveguide. After epitaxial growth in the undercut regions is complete, material selective etching is performed to create flat mirror facets perpendicular to the longitudinal axis of the waveguide.

BRIEF DESCRIPTION OF THE DRAWING

A more complete understanding of the invention may be obtained by reading the following description of specific illustrative embodiments of the invention in conjunction with the appended drawing in which:

FIGS. 4 and 5 show sequential processing stages in the formation of a buried undercut mesa waveguide wherein the undercut region is along a longitudinal axis of the waveguide;

FIG. 6 is a top view of a buried undercut mesa waveguide resonant incorporating the features shown in FIGS. 3 and 5.

DETAILED DESCRIPTION

Figure 1:
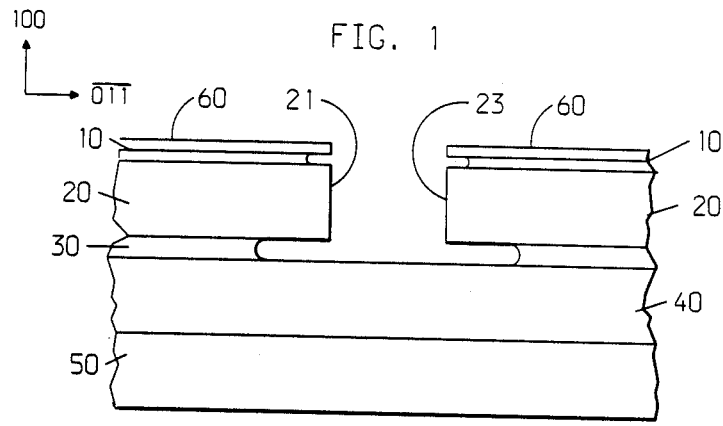
FIGS. 1 through 3 show sequential processing stages in the formation of a buried undercut mesa waveguide having an etched mirror facet.

In the description which follows, reference is made to the present invention as a method of fabricating a semiconductor heterostructure waveguide and the resulting waveguide. It should be clear to those skilled in the art that such a waveguide is well suited for operation as either a passive waveguide for guiding optical signals along its length or an active waveguide integrated into a semiconductor light source or modulator structure. Operation of the waveguide in an active environment such as a laser structure is preferred in order to realize many of the benefits obtained from fabricating the waveguide in accordance with the principles of this invention.

A multilayer semiconductor heterostructure crystal is grown by any of the well-known growth techniques such as liquid phase epitaxy, molecular beam epitaxy, vapor phase epitaxy, metal-organic chemical vapor deposition or the like. Two or more epitaxial layers are grown on a substrate. The heterostructure is comprised of material compounds from, for example, Group III–V, Group II–VI or Group IV materials. For transmission of optical signals in the region from 0.8 to 1.8 $\mu$m, presently the wavelength region of interest for optical communications, it is presently preferable to use binary Group III–V compounds, e.g., InP, GaAs and GaSb, and their ternary and quaternary derivatives.

As shown in FIGS. 1 through 6, layers comprising the heterostructure are defined as substrate 50, lower cladding layer 40, guiding layer 30, upper cladding layer 20, and cap layer 10. Composition, thickness and doping (conductivity type) parameters are selected according to well known methods for each heterostructure layer to provide a particular operating wavelength and capability for a particular operating function (passive vs. active) for the waveguide. For a detailed description of these parameters, refer to S. Sze, *Physics of Semiconductor Devices*, 2nd Ed., (New York: John Wiley & Sons, Inc., 1981), pp. 679–838.

In an example from practice, cap layer 10 is p+ type InGaAsP ($\lambda = 1.1$ $\mu$m), upper cladding layer 20 is p-type InP, guiding layer 30 is comprised of three layers including upper and lower antimeltback layers ($\lambda = 1.3$ $\mu$m) surrounding an active layer ($\lambda = 1.55$ $\mu$m) where the antimeltback layers and the active layer are quaternary alloys, lower cladding layer 40 is n-type InP, and substrate 50 is n+ type InP. Multiple layers in guiding layer 30 are often advantageous for fabricating long wavelength devices ($\lambda > 1.3$ $\mu$m) using certain growth techniques such as liquid phase epitaxy. A typical multilayer configuration for guiding layer 30 includes an active layer ($\lambda = 1.55$ $\mu$m) of approximately 0.05 to 0.3 $\mu$m thickness covered by an antimeltback layer ($\lambda = 1.3$ $\mu$m) of comparable thickness to avoid meltback problems during liquid phase epitaxial growth of upper cladding layer 20. In guiding layer 30, the upper antimeltback layer has p-type conductivity, the lower antimeltback layer has n-type conductivity, and the active layer is undoped.

In the example shown in the Figures, the device is formed on a 100 oriented substrate and the waveguide is shown having a longitudinal axis along the $0\overline{1}1$ direction. The $0\overline{1}1$ direction is desirable for fabrication of monolithic etched facet lasers and coupled cavity lasers in InGaAsP/InP heterostructures because of desirable etching qualities for this heterostructure system.

DESCRIPTION OF ETCHED MIRROR FACET FABRICATION

Figure 2:
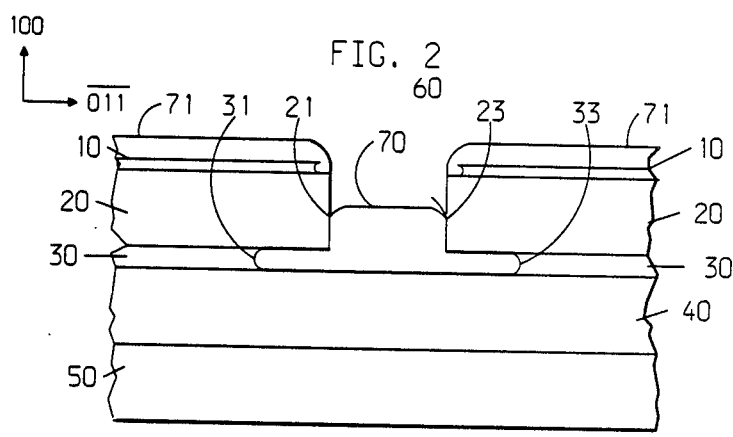
Figure 3:
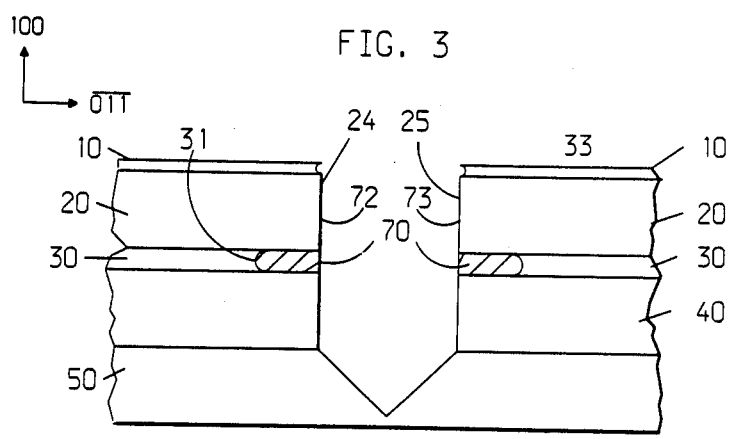

FIGS. 1 through 3 illustrate the fabrication sequence used to obtain vertical etched facets which can serve as, for example, mirrors or other functions. It should be noted that the same sequence of steps is used to form simultaneously the sides of the waveguide which will be discussed below in more detail with respect to FIGS. 4 and 5.

In FIG. 1, mask 60 is formed by conventional photolithographic techniques over cap layer 10 to define an unmasked region for a groove. Mask 60 is comprised, for example, of a layer of titanium over a layer of silicon nitride of silicon dioxide. After mask 60 is formed, the semiconductor heterostructure wafer is subjected to reactive ion etching to initiate formation of the groove through cap layer 10. From experimental practice, it is known that $Cl_2$ or $Cl_2 + O_2$ are well adapted for use as agents in reactive ion etching. For a detailed understanding of these reactive ion etching techniques, see U.S. Pat. No. 4,285,763, issued to L. A. Coldren on Aug. 25, 1981, L. A. Coldren et al., *IEEE Journal of Quantum Electronics*, Vol. QE-18, pp. 1679–82 (1982), and M. A. Bosch et al., *Applied Physics Letters*, Vol. 38, No. 4, pp. 264–6 (1981).

Wet chemical etching completes formation of the groove through cladding layer 20 stopping at the surface of guiding layer 30. Planar crystallographic surfaces 21 and 23 form the sides of the groove. Material selective and preferentially crystallographic chemical etchants are desirable for groove formation because such etchants produce well-defined planar facets and stop etching at an interface with a different material. For the InP/InGaAsP heterostructure system in this example, HCl is a material selective and preferential etchant for InP but not for InGaAsP. In other words, HCl will not etch InGaAsP and it will not etch through the $0\overline{1}1$ plane. Preferential and/or material selective etchants are disclosed in the following references: the Coldren et al. articles cited above; S. B. Phatak et al., *Journal of the Electrochemical Society*, Vol. 126, No. 2, pp. 287–92 (1979); R. P. Tijburg et al., *Journal of the Electrochemical Society*, Vol. 123, No. 5, pp. 687–91 (1976); and J. W. Faust, Jr., *Compound Semiconductors*, Vol. 1 (Reinhold Publ., 1963), pp. 445–68. For the heterostructure in this example, a groove −1.5 $\mu$m wide is etched with concentrated HCl at room temperature in approximately 1 minute.

A material selective etchant is then applied to the wafer to remove a portion of guiding layer 30 at the bottom of the groove and under upper cladding layer 20 thereby undercutting upper cladding layer 20. It should also be noted that this etching step may cause a portion of cap layer 10 to be similarly removed with mask 60 being undercut. Several material selective etchants are known for quaternary Group III–V alloys as used in the example, but the preferred etchant for this purpose is $K_3Fe(CN)_6$:KOH:$H_2O$ (6:4:30) which undercuts into the guiding layer 30 at about 1.0 $\mu$m for each 10 seconds of etching time. If cap layer 10 is composed of wider bandgap material (e.g., $\lambda = 1.1$ $\mu$m) than is guiding layer 30, then the cap layer 10 will be undercut at a slower rate than guiding layer 30 as shown in FIG. 1. For other etchants of quaternary alloys, see U.S. Pat. No. 4,354,898, issued to L. A. Coldren et al. on Oct. 19, 1982 and the earlier-mentioned Coldren et al. article.

After the previous processing steps, the wafer shown in FIG. 1 is subjected to a standard chemical bath to remove mask 60. For the remaining processing steps, cap layer 10 acts as self-aligned aperture mask layer.

As depicted in FIG. 2, vapor phase epitaxial regrowth of semiconductor material in the groove causes regrown groove layer 70 to be formed on the heterostructure wafer completely filling in the undercut region between upper cladding layer 20 and lower cladding layer 40 and abutting end surfaces 31 and 33 of guiding layer 30. Also, regrown layer 71 is formed over cap layer 10 covering the remainder of the exposed field of the wafer. Epitaxial growth time is selected to permit complete filling in of undercut regions and formation of an approximately 0.5 to 1.0 $\mu$m thick layer in the field (thickness of layers 70 and 71). Partial filling may also occur.

Hydride vapor phase epitaxial growth techniques are employed. For a description of hydride vapor phase epitaxial growth techniques, see an article by G. H. Olsen in *GaInAsP Alloy Semiconductors*, ed. T. P. Pearsall (New York: John Wiley & Sons, Inc., 1982), p. 18. However, conditions of growth differ markedly from those used for conventional planar growth as enumerated in the cited article. Regrowth in a groove occurs with minimal defects at a growth temperature of approximately 600 degrees C. compared with 675 to 700 degrees C. for conventional planar growth. This is a desirable temperature for regrowth because the undercut region fills in essentially completely. Other materials and substrate orientations may have different temperatures which will be easily determined by those skilled in the art.

It is believed that the temperature is determined by the different growth rates along different crystallographic orientations required to fill in the undercut region. In addition, the gas flows are somewhat different. For example, the regrowth condition prefers an HCl flow rate over the indium of 1.5 ml/minute while the planar growth condition requires a typical flow rate of 15 ml/minute. The lower flow rate is desirable because it permits a more uniform distribution of growth constituents throughout the undercut mesa region. The phosphine flow remains at 12 ml/minute in both cases. In both cases, the total flow in the reactor is held to a rate of 2000 ml/minute. Regrowth typically is completed in 1 or 2 minutes for a groove 2 to 4 $\mu$m long. The low temperatures and short deposition times involved in the regrowth process are very favorable in that deleterious effects to the laser device caused by heating are minimized. In the mass transport technique, it takes 60 minutes at a temperature of about 650 degrees C. or greater to complete the process.

Other vapor phase epitaxial growth techniques contemplated for filling in the undercut regions are halide vapor phase epitaxy and metal organic chemical vapor deposition. The term "vapor phase epitaxial growth technique" is used to mean those growth techniques in which the grown material is externally supplied by a flowing gas stream thereby permitting control of composition and doping levels. Thus, mass transport is not included.

Both regrown groove layer 70 and regrown layer 71 are comprised of high resistivity semiconductor material similar in alloy composition to upper cladding layer 20. For purposes of the present application, high resistivity is characterized by a low free carrier concentration of approximately $10^{15}$ cm$^{-3}$ or lower, where the dopant material is either n- or p-type conductivity. It is contemplated that the high resistivity semiconductor material can be comprised of intrinsic semiconductor material or semi-insulating material such as Fe-doped InP. In the exemplary device described, low doped (n-type) InP ($10^{15}$ cm$^{-3}$) is used to form regrown groove layer 70 and regrown layer 71. Of course, regrown layers 70 and 71 need not be high resistivity or have a composition similar to that of layer 20.

Final mirror facet formation is accomplished, as shown in FIG. 3, by etching to remove the semiconductor material comprising regrown layer 71, regrown groove layer 70, upper cladding layer 20, and lower cladding layer 40. A crystallographically preferential, material selective etchant is employed to produce mirror facets 24 and 25 on the sides of the groove defined by the self-aligned mask provided by cap layer 10. Since the etchant is crystallographically preferential, each mirror facet is a stop-etch crystal plane for the semiconductor material. For InP, this plane is $0\overline{1}1$ when HCl is used as the etchant. The groove is shown extending into substrate 50 because substrate 50 and lower cladding layer 40 are comprised of the same semiconductor material. As a result of this etching step, each facet is perfectly aligned and planar from upper cladding layer 20 through guiding layer 30 to lower cladding layer 40.

If the device is an active type, then metal electrical contacts can be evaporated or plated through windows opened in a patterned dielectric onto cap layer 10. Alternatively, this contact step can be carried out prior to the final mirror wet etching described above. *Description of Mesa Waveguide Fabrication*

In order to create a mesa waveguide as shown in FIG. 4, it is necessary to follow many of the same steps already described above. For example, mask 60 (not shown in FIG. 4) is formed by conventional photolithographic methods over cap layer 10 to define the lateral extent of the top of the mesa. After mask 60 is formed, the semiconductor heterostructure wafer is subjected to reactive ion etching to define the lateral edges of the mesa down through cap layer 10.

Wet chemical etching completes formation of the mesa through upper cladding layer 20 stopping at the surface of guiding layer 30. Material selective chemical etches are desirable for mesa formation because such etchants produce reasonably well-defined planar facets, such as sloping sidewall 26 and sloping sidewall 27, and stop etching at the interface with a different semiconductor alloy. For the InP/InGaAsP heterostructure system of this example, HCl is a material selective and preferential etchant for InP but not for InGaAsP.

A material selective etchant is then applied to the wafer to remove a portion of guiding layer 30 between upper cladding layer 20 and lower cladding layer 40 and thereby undercut upper cladding layer 20. The amount of undercut is predetermined to provide a waveguide having a desired width, that is, the distance from end surface 34 to end surface 35 through guiding layer 30, which yields fundamental transverse mode operation. It should also be noted that this etching step causes cap layer 10 to be similarly affected with mask 60 being undercut. In some instances, the cap layer 10 is desirably coated with a dielectric mask to prevent etching of cap layer 10 during the undercutting step. Thus, the structure depicted in FIG. 4 results. Those skilled in the art will easily ascertain suitable lithographic techniques for the dielectric mask deposition. Several material selective etchants are known for quaternary Group III-V alloys as used in the example from experimental practice, but the preferred etchant for this purpose is $K_3Fe(CN)_6:KOH:H_2O$ (6:4:30). For other etchants of quaternary alloys, see U.S. Pat. No. 4,354,898, issued to L. A. Coldren et al. on Oct. 19, 1982 and the earlier-mentioned Coldren et al. article.

Vapor phase epitaxial regrowth of semiconductor material along the mesa causes regrown layer 63 and regrown layer 64 to be formed on the wafer completely filling in the undercut region below upper cladding layer 20 adjacent to guiding layer 30 as shown in FIG. 5. Appropriate growth conditions were previously described for the etched mirror and need not be repeated here. Growth time is selected to permit complete or partial filling in of undercut regions and usually the formation of a 0.5 to 1.0 $\mu m$ layer in the field (thickness layers 63 and 64). Other techniques contemplated for filling in the undercut regions are halide vapor phase epitaxy and metal organic chemical vapor deposition.

Regrown layer 63, regrown layer 64, and regrown layer 71 are comprised of high resistivity semiconductor material similar in composition to upper cladding layer 20. For purposes of the present application, high resistivity is characterized by a low free carrier concentration of approximately $10^{15}$ cm$^{-3}$ or less, where the dopant material is either n- or p-type conductivity. It is contemplated that the high resistivity semiconductor material can be comprised of semi-insulating material such as Fe-doped InP or intrinsic semiconductor material. In one exemplary embodiment, low doped n-type InP $10^{15}/cm^3$ is used to form regrown layer 63, regrown layer 64 and regrown layer 71. Of course, regrown layers 70 and 71 need not be high resistivity or have a composition similar to that of layer 20.

Final processing of the waveguide may include removal of regrown layer 71 unless its presence is desirable for reduced contact pad capacitance, an insulating film (e.g., $SiO_2$) over exposed fields of the wafer, opening contact windows through the insulating film via photolithographic techniques to access the mesa at cap layer 10 and finally applying suitable doped contacts to the exposed mesa. For a passive waveguide, that is, a waveguide which is neither electrically pumped for light emitting operation nor subject to an applied electric field for modulation, the steps of opening contact windows on the mesa and forming contacts are not necessary.

Figure 7:
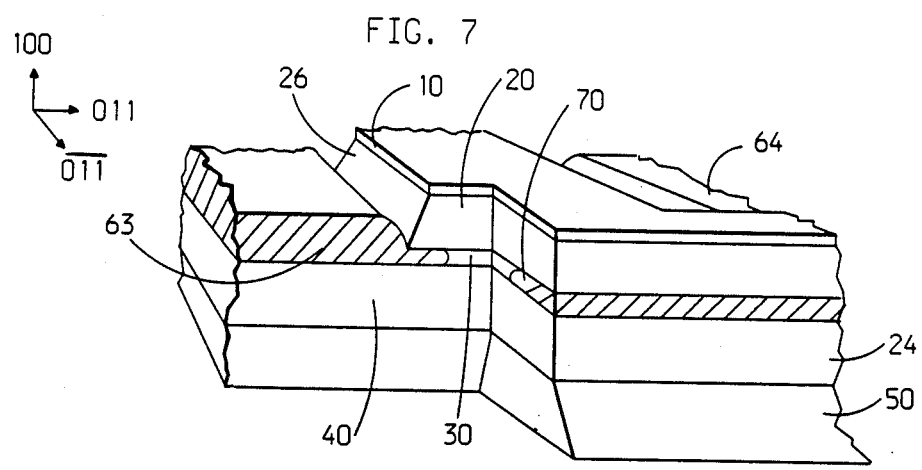
FIG. 7 is a composite cutaway (A—A) drawing of the buried undercut mesa waveguide resonant shown in FIG. 6.

FIG. 6 shows a top view and FIG. 7 is a cutaway view (A—A from FIG. 6 is shown) of a heterostructure processed to have a buried undercut mesa waveguide with etched mirror facets.

It should be clear to those skilled in the art that the fabrication of the waveguide and the etched mirror facets can be carried out simultaneously. Thus, two undercut regions are formed which are orthogonal. It should also be clear that other orientations of the heterostructure crystal or the longitudinal axis of the waveguide are equally well suited for this technique. Further, it should be clear to those skilled in the art that mirror facets can be cleaved on the ends of the waveguide.

Finally, without departing from the spirit and scope of the invention, the above-described techniques are also applicable to formation of a distributed feedback structure where any of layers 20, 30 or 40 have a periodic corrugation.

What is claimed is:

1. A method of fabricating a device comprising a buried undercut region comprising the steps of:
   growing a semiconductor heterostructure, said heterostructure comprising at least two layers of which at least one is a buried layer;
   using a material selective etchant to remove a portion of said at least one buried layer thereby forming an undercut region under at least one layer of said heterostructure; and
   regrowing said undercut region by a vapor phase epitaxial growth technique.

2. A method as recited in claim 1 further comprising the step of removing a portion of said regrown material to form mirror facets.

3. A method as recited in claim 1 in which said at least one buried layer has a long axis.

4. A method as recited in claim 3 in which said undercut region is parallel to the long axis of said at least one buried layer.

5. A method as recited in claim 3 in which said undercut region is perpendicular to the long axis of said at least one buried layer.

6. A method as recited in claim 1 in which said regrowing is at a temperature below 650 degrees C.

7. A method as recited in claim 2 further comprising the step of forming a mesa prior to said etching.

8. A method as recited in claim 7 which said regrowing forms a high resistivity region.

9. A method as recited in claim 7 comprising the further step of adding electrical contacts.

10. A method as recited in claim 1 in which two undercut regions are formed.

11. A method as recited in claim 10 in which said two undercut regions are mutually orthogonal.

* * * * *